United States Patent [19]
Shibao

[11] Patent Number: 5,309,269
[45] Date of Patent: May 3, 1994

[54] LIGHT TRANSMITTER

[75] Inventor: Shinji Shibao, Kanagawa, Japan

[73] Assignee: Mitsubishi Denki Kabushiki Kaisha, Tokyo, Japan

[21] Appl. No.: 857,173

[22] Filed: Mar. 25, 1992

[30] Foreign Application Priority Data

Apr. 4, 1991 [JP] Japan .................... 3-71646
Apr. 12, 1991 [JP] Japan .................... 3-79781

[51] Int. Cl.$^5$ ............................. H04B 10/04
[52] U.S. Cl. ........................ 359/187; 359/181; 359/182; 359/184; 372/38
[58] Field of Search ............... 359/180-182, 359/184-187, 161; 372/29-30, 38; 250/504 R; 328/147, 149; 332/123

[56] References Cited

U.S. PATENT DOCUMENTS

| | | | |
|---|---|---|---|
| 4,277,846 | 7/1981 | Chen | 359/181 |
| 4,796,266 | 1/1989 | Banwell et al. | 372/38 |
| 4,813,048 | 3/1989 | Yamane et al. | 372/29 |
| 4,903,273 | 2/1990 | Bathe | 372/38 |
| 5,077,619 | 12/1991 | Toms | 359/187 |

FOREIGN PATENT DOCUMENTS

| | | | |
|---|---|---|---|
| 3404444 | 8/1984 | Fed. Rep. of Germany | 372/38 |
| 3333247 | 3/1985 | Fed. Rep. of Germany | 372/38 |
| 244420 | 2/1985 | Japan . | |
| 0258484 | 10/1989 | Japan | 372/29 |

Primary Examiner—Leslie Pascal
Assistant Examiner—K. Negash
Attorney, Agent, or Firm—Wolf, Greenfield & Sacks

[57] ABSTRACT

A light transmitter for preventing the degradation of the extinction ratio and the occurrence of pulse width distortion in the light output in spite of the variation of current to light conversion efficiency A of the laser diode. The transmitter uses the characteristics such that the light pulse width becomes narrower than the modulation current pulse width if the laser diode is modulated by a bias current smaller than the threshold level. The light transmitter includes mismatch detection circuit (14) which detects the decrease of the light pulse width. By the detected mismatch signal, the modulation current control circuit (15) limits to increase the modulation current. The modulation current control circuit (15) operates together with the control circuit which controls automatically the light output peak value to be constant.

16 Claims, 5 Drawing Sheets

LIGHT TRANSMITTER

BACKGROUND OF THE INVENTION

The invention relates to a light transmitter for preventing the degradation of the extinction ratio of a light signal and the occurrence of pulse width distortion.

FIG. 3 is a block diagram of the prior transmitter disclosed in Japanese Patent publication 2-44420/1990. In FIG. 3, 1 is a transmitting data input terminal. 2 is a modulator connected to the transmitting data input terminal 1. 3 is a laser diode. 4 is a light receiving element for receiving a part of the output light from the laser diode 3. 5 is a capacitor connected in parallel to the light receiving element 4. 6 is a bias voltage source for supplying the voltage to the light receiving element 4. 7 is a current amplifier. 8 is a first reference current source. 9 is a second reference current source. 10 is a switching circuit connected to the output terminal of the second current source 9 for switching the second current source in response to the binary transmitted data.

The operation of the conventional light transmitter is described hereinafter. The output current from the reference current source 9 is added to the second output current by the switching circuit 10 in response to the binary transmitted data. The relation between the currents 101 outputted from the first current source, $I_{O2}$ outputted from the second current source and the reference current $I_O$ is obtained as follows.

$$I_O = I_{O1} - m \cdot I_{O2} \quad (1)$$

where, $I_O$: reference current
$I_{O1}$: output current of the first reference current source
$I_{O2}$: Output current of the second reference current source
m: mark rate of the digital signal The output light of the laser diode 3 is radiated to the light receiving element 4. The current $I_{PD}$ flowing the light receiving element 4 is in proportion to the output light of the laser diode as shown in the following equation.

$$I_{PD} = m \cdot D \cdot L \cdot P_{out} \quad (2)$$

where, $I_{PD}$: current flowing the light receiving element
D: pulse duty factor
L: current conversion efficiency from the laser diode to the light receiving element
$P_{out}$: peak value of the light output The current difference $(I_0 - I_{PD})$ between the synthesized current 10 and the current $I_{PD}$ flowing in the light receiving element 4 is amplified by the current amplifier 7 and applied to the laser diode 3. The current $I_{PD}$ flowing in the light receiving element 4 is averaged in the capacitor 5 connected in parallel to the light receiving 4. The current $I_B$ applied to the laser diode 3 is obtained as follows.

$$I_B = \beta(I_0 - I_{PD}) \quad (3)$$

where, $I_B$: bias current sink current of the current amplifier)
$\beta$: amplification factor of the current amplifier The current to light conversion characteristics of the laser diode 3 is shown in FIG. 4. From the FIG. 4, the peak value $P_{out}$ of the light output of the laser diode is obtained in the following equation.

$$P_{out} = A(I_B + I_{op} - I_{th}) \quad (4)$$

where, $I_{op}$: modulation current (sink current of the modulator)
$I_{th}$: threshold current of the laser diode
A: current to light conversion efficiency of the laser diode From the equations (1) to (4), the next equation is obtained.

$$P_{out} = \{A \cdot \beta \cdot I_O + A(I_{op} - I_{th})\}/(1 + A \cdot \beta \cdot m \cdot D \cdot L) \quad (5)$$

The equations from (1) to (4) shows that the bias current $I_B$ is controlled so that the peak value of the light output $P_{out}$ may be constant if the threshold current $I_{th}$ varies by some reasons. That is, if $I_{th}$ increases to $I_{th}'$, the bias current $I_B$ is controlled automatically to increases to $I_B'$ in order to maintain the constant light output by the current amplifier as shown in FIG. 5.

For the initial condition, $I_B$ is set as follows as shown in FIGS. 4, 5 and 7.

$$I_B = I_{th} \quad (6)$$

By setting $I_B = I_{th}$ as shown in the equation (6), the equation (5) is satisfied so that $P_{out}$ may be constant if the threshold current of the laser diode $I_{th}$ varies.

Since the conventional light transmitter is constructed such as described above, when the current to light conversion efficiency A of the laser diode degrades, IB changes as shown in equation (7) even if $I_B$ is set as $I_B = I_{th}$ at the initial state as shown in the equation (6). The reason lies in the fact that the modulation current Iop is always constant.

$$I_B > I_{th} \quad (7)$$

As a result, the extinction ratio of the light signal decreases.

On the hand, if the current to light conversion efficiency A of the laser diode increases, $I_B$ changes as follows.

$$I_B < I_{th} \quad (8)$$

In this case, there are some problems such that pulse width distortion occurs in the light signal.

Therefore, it is a primary object of the present invention to provide a light transmitter for maintaining the peak value of the light output constant as shown in the equation (6) even if the current to light conversion efficiency A of the laser diode varies.

SUMMARY OF THE INVENTION

A light transmitter comprising a first current to voltage conversion circuit for converting the signal current flowing in the light receiving element to a voltage signal, a second current to voltage conversion circuit for converting the modulation current outputted from the modulator to a voltage signal and a mismatch detection circuit for detecting the mismatch between the current outputted from the first current to voltage conversion circuit and the current outputted from the second current to voltage conversion circuit, and a modulation current control circuit for limiting the modulation current by the detected output voltage.

DETAILED DESCRIPTION OF THE PREFERRED EMBODIMENTS

First Embodiment

Figure 1:
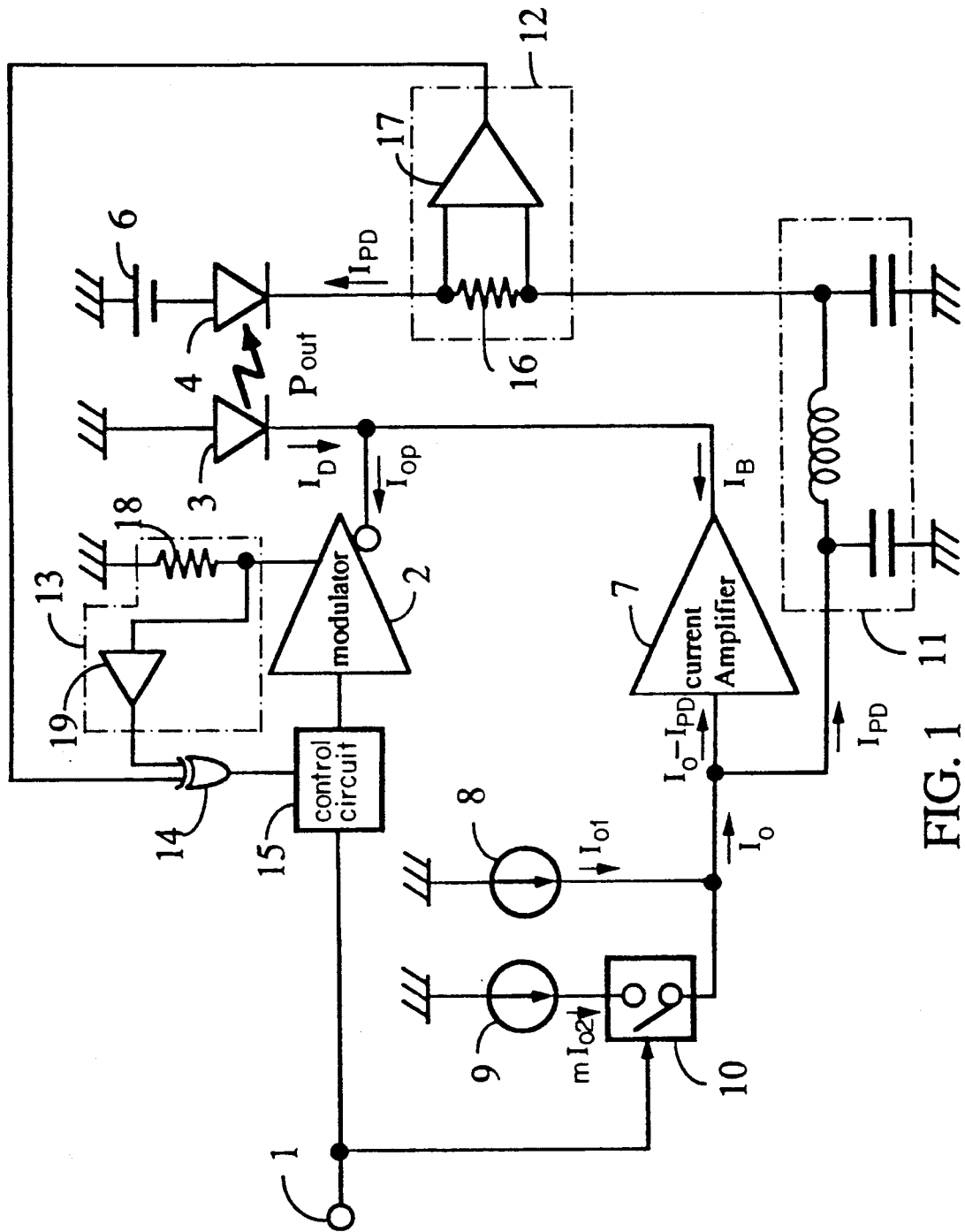
FIG. 1 is a circuit diagram of a first embodiment of the present invention
Figure 3:
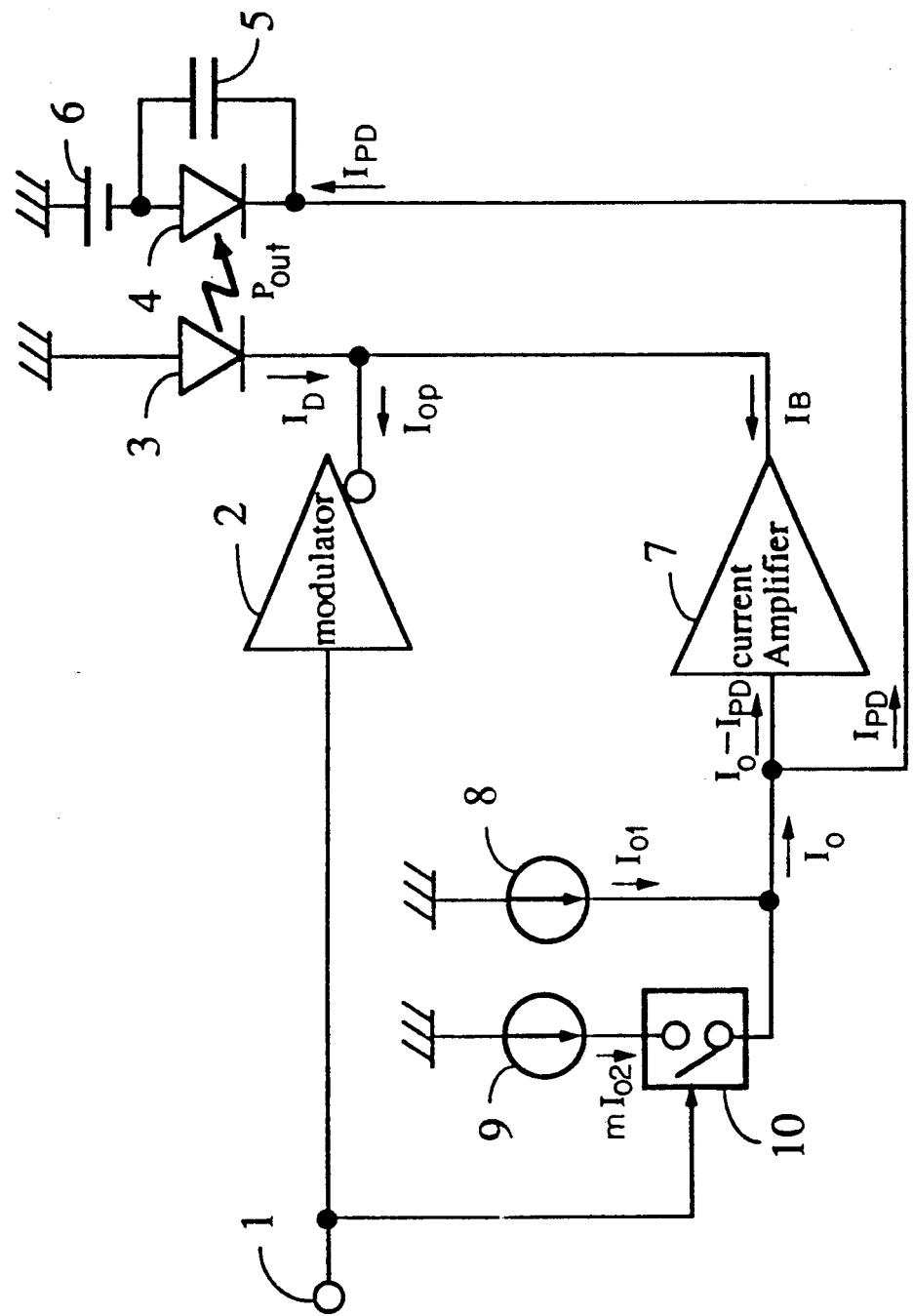
FIG. 3 is a circuit diagram of the prior art embodiment
Figure 4:
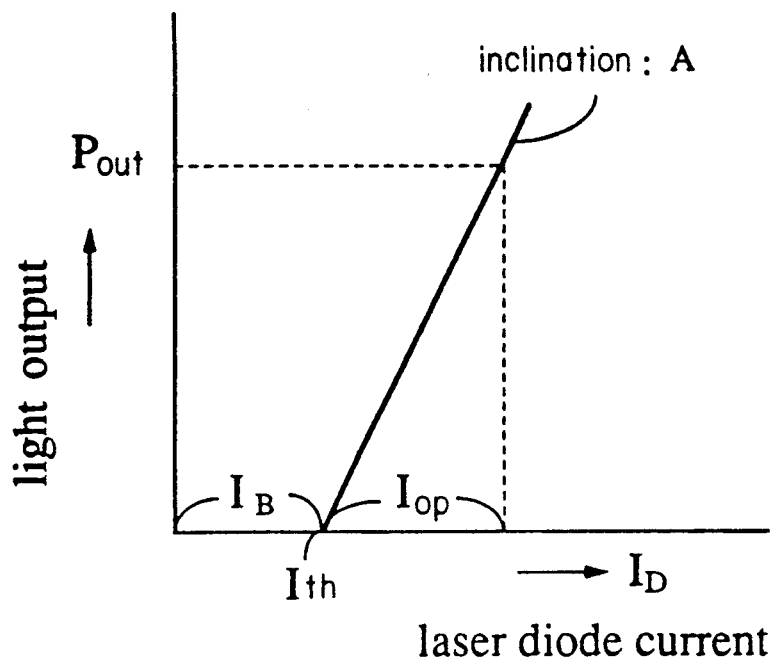
FIG. 4 is a characteristic figure showing the relation between the light output and the laser diode current
Figure 5:
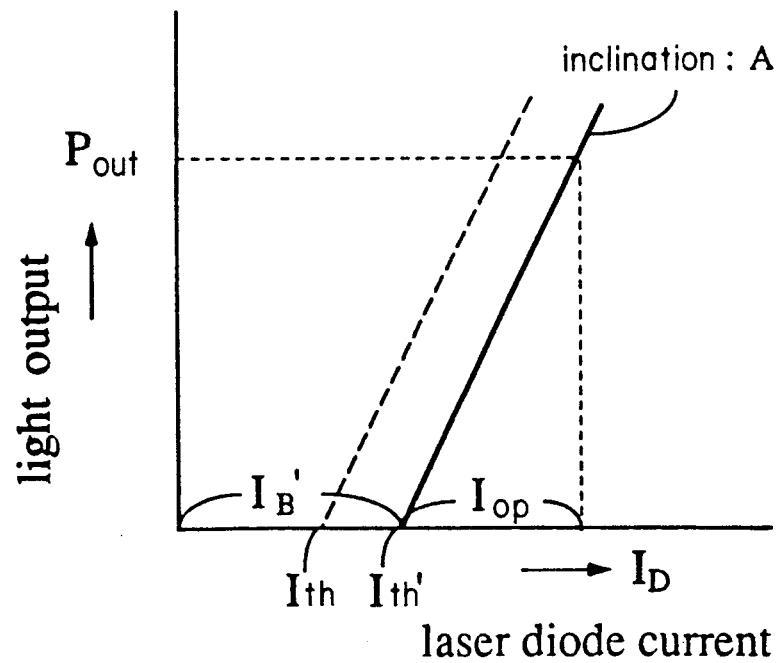
FIG. 5 is a characteristic figure showing the relation between the light output and the laser diode current when the threshold level of the laser diode increases

FIG. 1 is a circuit diagram of a first embodiment of the present invention. In FIG. 1, 11 is a filter for averaging the current flowing in the light receiving element 4. 12 is a first current to voltage conversion circuit. 13 is a second current to voltage conversion circuit. 14 is a mismatch detection circuit for detecting the mismatch between the output of the first current to voltage conversion circuit 12 and the output of the second current to voltage conversion circuit 13. 15 is a modulation current control circuit for controlling the modulation current by the output current of the mismatch detection circuit 14. 16 is first current to voltage conversion resistor in the first current to voltage conversion circuit 12. 17 is an amplifier for amplifying the output of the first current to voltage conversion resistor. 18 is second current to voltage conversion resistor in the second current to voltage conversion circuit 13. 19 is a second amplifier for amplifying the output of the second current to voltage conversion resistor. Other elements of the first embodiment are the same as those having the same numerals in FIG. 3, and therefore the detailed descriptions are omitted.

The operation of the first embodiment of the present invention is described now. In the first embodiment, the circuit operates in the same manner as that of the conventional circuit for controlling the light output $P_{out}$ to be constant. The difference from the conventional circuit is in that the first embodiment uses a filter 11 for averaging current $I_{PD}$ flowing in the light receiving element 4. Resistor 16 is supplied to convert the current $I_{PD}$ to a voltage signal without being averaged. The second current to voltage converter 13 equivalently converts the inverted modulated current to a voltage signal. The output voltages of the first current to voltage conversion circuit 12 and the second current to voltage conversion circuit 13 are applied to the mismatch detection circuit 14. The mismatch detection circuit 14 detects the mismatch of the pulse width of the two voltage output signals.

Figure 6:
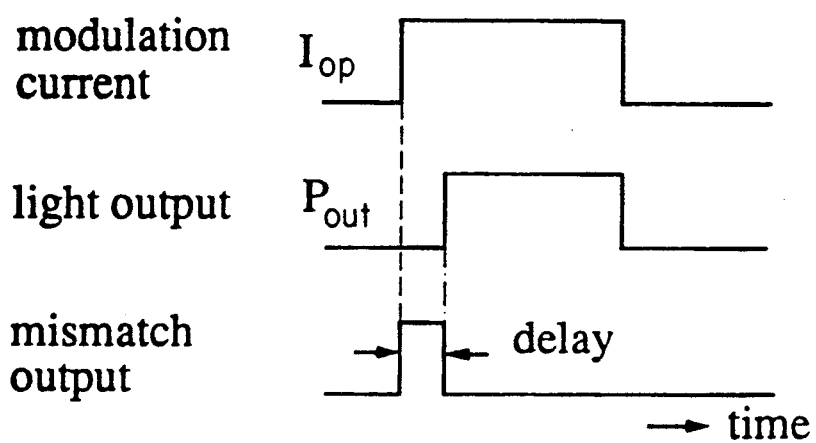
FIG. 6 shows a timing chart between the modulation current, the light output and the mismatch output signal

The laser diode has a characteristic in connection with the modulation current and the output light as shown in FIG. 6. As easily understood from FIG. 6, the rise time of the output light lags from the modulation current and then the pulse width of the light output becomes narrower at the condition of the equation (8). When the rise time of the output light lags at the condition of the equation (8), the mismatch detection signal is outputted from the mismatch detection circuit 14. The modulation current control circuit 15 controls to limit to increase the modulation current lop when the mismatch signal is generated. Therefore the bias current $I_B$ decreases in order to maintain the constant light output $P_{out}$ and then the condition shown in the formula (6) is maintained. Because, it is necessary to have the relation $(I_B+I_{op}=$constant) for maintaining the constant power $P_{out}$.

Figure 7:
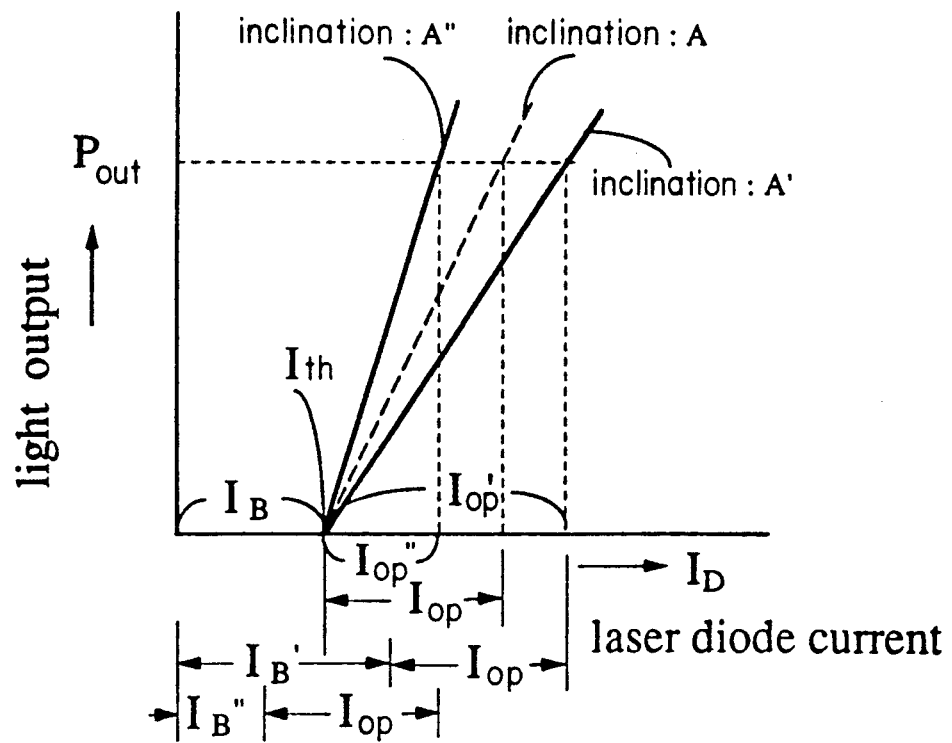
FIG. 7 is a characteristics figure showing the relation between the light output and the laser diode current when the current to light conversion efficiency A varies.

The detailed explanation follows in connection with the operation of the modulation current control circuit 15. Assume that the current to light conversion efficiency A of the laser diode decreases to A' as shown in FIG. 7. The bias current $I_B$ increases to $I_B'$ for a short time by the auto light level control circuit (not shown in the figure) as shown in FIG. 7 in order to maintain the constant light output $P_{out}$. Because the modulation current $I_{op}$ can not change instantly. In this occasion (at the condition of the equation (7)), since the mismatch pulse is not outputted from the mismatch detection circuit 14, the modulation current $I_{op}$ outputted from the modulation current control circuit 15 gradually increases up to $I_{op}'$. During the modulation current $I_{op}$ increases, the bias current $I_B'$ decreases, because $(I_{op}+I_B')$ must be constant in order to maintain a constant light output $P_{out}$. When the modulation current $I_{op}$ becomes equal to $I_{op}'$, the bias current becomes $I_B$ and the formula (6) is satisfied. Therefore the system is stabilized.

On the contrary, assume that the current to light conversion efficiency A of the laser diode increases to A" as shown in FIG. 7. The bias current $I_B$ decreases to $I_B''$ for a short time as shown in FIG. 7 in order to maintain the constant light output $P_{out}$, because the modulation current $I_{op}$ can not change instantly. In this occasion (at the condition of the equation (8)), since the mismatch pulse is outputted from the mismatch detection circuit 14, the modulation current $I_{op}$ outputted from the modulation current control circuit 15 gradually decreases down to $I_{op}''$. During the modulation current $I_{op}$ decreases, the bias current $I_B''$ increases, because $(I_{op}+I_B'')$ must be constant in order to maintain a constant light output $P_{out}$. When the modulation current $I_{op}$ becomes equal to $I_{op}''$, the bias current becomes equal to $I_B$ and the formula (6) is satisfied. Therefore the system is stabilized.

These operations satisfy the equations (4) and (6) at the same time. Therefore the following equation is obtained.

$$P_{out}=A \cdot I_{PD} \tag{9}$$

Second Embodiment

Figure 2:
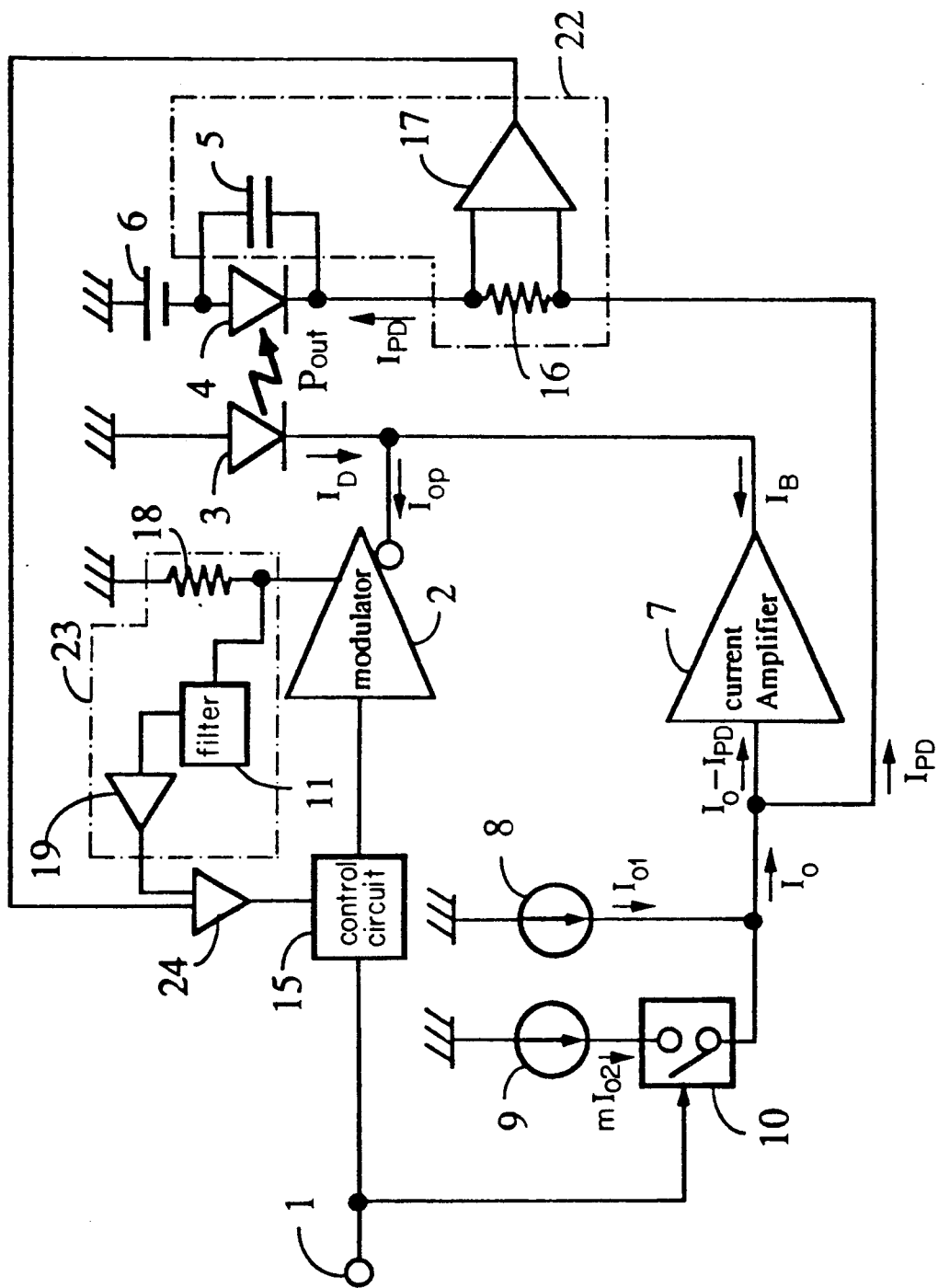
FIG. 2 is a circuit diagram of a second embodiment of the present invention

FIG. 2 is a circuit diagram of a second embodiment the present invention. In FIG. 2, 11 is a filter for averaging the modulated current outputted from the modulator. 22 is a first current to voltage conversion and averaging circuit. 23 is a second current to voltage conversion and averaging circuit. 24 is a comparison circuit for comparing the outputs between the output of the first current to voltage conversion and averaging circuit 22 and the output of the second current to voltage conversion and averaging circuit 23. 15 is a modulation current control circuit for controlling the modulation current by the output signal of the comparison circuit 24. 16 is first current to voltage conversion resistor in the first current to voltage conversion and averaging circuit 22. 17 is an amplifier for amplifying the output of the first current to voltage conversion resistor 16. 18 is second current to voltage conversion resistor for supplying the voltage to a second current to voltage conversion and averaging circuit 23. 19 is a second amplifier for amplifying the output of the second current to voltage conversion resistor. Other elements of the first embodiment are the same as those having the same numerals in FIG. 2, and therefore the detailed descriptions are omitted.

The operation of the second embodiment of the present invention is described now. In the second embodiment, the circuit operates in the same manner as that of the conventional circuit for controlling the light output $P_{out}$ to be constant. The difference from the conventional circuit is in that the second embodiment uses the filter 11 for averaging the voltage converted by the second resistor 18 from the modulation current $I_{op}$ outputted from the modulator 2. The first current to voltage conversion and averaging circuit 22 converts the current $I_{PD}$ flowing in the light receiving element 4 to a voltage signal. In this circuit, the current flowing in the light receiving element 4 is averaged by the capacitor 5 connected to the diode 4 as shown in FIG. 2. The output voltages of the first current to voltage conversion and averaging circuit 22 and the second current to voltage conversion and averaging circuit 23 are applied to the comparison circuit 24. The comparison circuit 24 compares the two voltage signals and outputs a control signal for limiting to increase the modulation current $I_{op}$ if the output of the second current to voltage conversion and averaging circuit 23 is greater than the output of the first current to voltage conversion and averaging circuit 22.

The laser diode has a characteristic as shown in FIG. 6 in connection with the modulation current and the output light. In FIG. 6, when the rise time of the light output lags the modulation current, then the pulse width of the light output becomes narrower and the averaged level decreases at the condition of the equation (8). The modulation current control circuit 15 controls to limit to increase the modulation current $I_{op}$ when the averaged level decreases. Therefore the bias current $I_B$ decreases in order to maintain the constant light output $P_{out}$ and then the condition shown in the equation (6) is maintained, because, it is necessary to have the relation ($I_B+I_{op}$=constant) for maintaining the constant light output power $P_{out}$.

A detailed explanation follows in connection with the operation of the modulation current control circuit 15. Assume that the current to light conversion efficiency A of the laser diode decreases to A' as shown in FIG. 7. The bias current $I_B$ increases to $I_B'$ for a short time as shown in FIG. 7 in order to maintain the constant light output $P_{out}$, because the modulation current $I_{op}$ can not change instantly. In this occasion (at the condition of the equation (7)), since the output level from the comparison circuit 24 is lower than the averaged output level of the modulated pulse current, the modulation current $I_{op}$ outputted from the modulation current control circuit 15 gradually increases up to $I_{op}'$. During the modulation current $I_{op}$ increases, the bias current $I_B'$ decreases, because ($I_{op}+I_B'$) must be constant in order to maintain a constant light output $P_{out}$. When the modulation current $I_{op}$ becomes equal to $I_{op}'$, the bias current becomes $I_B$ and the equation (6) is satisfied. Therefore the system is stabilized. On the contrary, assume that the current to light conversion efficiency A of the laser diode increases to A" as shown in FIG. 7. The bias current $I_B$ decreases to $I_B''$ for a short time by the auto light level control circuit (not shown in the figure) as shown in FIG. 7 in order to maintain the constant light output $P_{out}$, because the modulation current $I_{op}$ can not change instantly. In this occasion (at the condition of the equation (8)), since the output level from the comparison circuit 24 is higher thin the averaged output level of the modulated pulse current, the modulation current $I_{op}$ outputted from the modulation current control circuit 15 gradually decreases down to $I_{op}''$. During the modulation current $I_{op}$ decreases, the bias current $I_B''$ increases, because ($I_{op}+I_B''$) must be constant in order to maintain a constant light output $P_{out}$. When the modulation current $I_{op}$ becomes equal to $I_{op}''$, the bias current becomes equal to $I_B$ and the formula (6) is satisfied. Therefore the system is stabilized. These operations satisfy the equations (4) and (6) at the same time. Therefore the equation (9) is also obtained.

What is claimed is:

1. A light transmitter having a modulator which applies a binary modulation current to a light generation element, and in response to binary transmitted data, a light receiving element which receives a part of the light from the light generation element means for applying a current to the light generation element in proportion to the current difference between a reference current generated in the reference current source and a current flowing in the light receiving element, the transmitter comprising:

a first current to voltage conversion circuit for converting the signal current flowing in the light receiving element to a voltage signal;

a second current to voltage conversion circuit for converting the modulation current outputted from the modulator to a voltage signal;

a mismatch detection circuit for receiving, and determining the mismatch between, the voltage outputted from the first current to voltage conversion circuit and the voltage outputted from the second current to voltage conversion circuit and for providing an output; and a modulation current control circuit for controlling the modulation current of the modulator in response to the output from the mismatch detection circuit.

2. The transmitter of claim 1 further comprising a reference current source including a first reference current source, a second reference current source, a switch circuit connected to the output terminal of the second reference current source for switching the current ON-OFF in response to the binary transmitted data, and means for combining the currents outputted from the first reference current source and from the switch circuit.

3. A light transmitter having a modulator which applies a binary modulation current to a light generation element in response to binary transmitted data, a light receiving element which receives a part of the light from the light generation element, and means for applying a current to the light generation element in proportion to the current difference between a reference current generated in the reference current source and a current flowing in the light receiving element, the transmitter comprising:
- a first current to voltage conversion and averaging circuit for converting the signal current flowing in the light receiving element to a voltage signal;
- a second current to voltage conversion and averaging circuit for converting the modulation current outputted from the modulator to a voltage signal;
- a comparison circuit for comparing the output voltage from the first current to voltage conversion and averaging circuit and the voltage from the second current to voltage conversion and averaging circuit; and
- a modulation current control circuit for controlling the modulation current of the modulator by the output of the comparison circuit.

4. The transmitter of claim 3 further comprising a reference current source including a first reference current source, a second reference current source, a switch circuit connected to the output terminal of the second reference current source for switching the current ON-OFF in response to the binary transmitted data, and means for combining the currents outputted from the first reference current source and from the switch circuit.

5. A light transmitter comprising:
- a light generating element;
- a modulator for applying a modulation current to the light generation element;
- a light receiving element which receives part of the light from the light generation element;
- a circuit for detecting and comparing the current flowing in the light receiving element and the modulation current and for providing a comparison signal; and
- a modulation current control circuit for controlling the modulation current of the modulator in response to the comparison signal.

6. The transmitter of claim 5 wherein the circuit for detecting and comparing includes a first current to voltage conversion circuit for converting the current flowing in the light receiving element to a voltage, and a second current to voltage conversion circuit for converting the modulation current to a voltage.

7. The transmitter of claim 6 wherein at least one of the first and second current to voltage circuits comprises a resistor and an amplifier.

8. The transmitter of claim 5 wherein the circuit for detecting and comparing includes a first circuit for averaging the current flowing through the light receiving element, and a second circuit for averaging the modulation current.

9. The transmitter of claim 8 wherein the circuit for detecting and comparing further comprises a first current to voltage conversion circuit for converting the current flowing in the light receiving element to a voltage, and a second current to voltage conversion circuit for converting the modulation current to a voltage.

10. The transmitter of claim 9 wherein at least one of the first and second current to voltage circuits comprises a resistor and an amplifier.

11. A method for maintaining constant extinction ratio and pulse width in a light transmitter comprising a light generating element, a light receiving element which receives part of the light from the light generation element, and a modulator for providing a modulation current to the light generation element, when the current to light conversion efficiency of the light generating element varies, the method comprising the steps of:
- detecting the current flowing through the light receiving element;
- detecting the modulation circuit;
- comparing the detected currents;
- providing a comparison signal based on the comparing step and
- changing the modulation current in response to the comparison signal.

12. The method of claim 11 wherein the step of detecting the modulation current comprises converting the modulation current to a voltage, and the step of detecting the current flowing through the light receiving element comprised converting the current flowing through the light receiving element to a voltage.

13. The method of claim 12 further comprising averaging the current flowing through the light receiving element.

14. The method of claim 11 further comprising averaging the current flowing through the light receiving element.

15. The method of claim 12 wherein the step of changing comprises increasing the modulation current when there is no comparison signal, and limiting the increase in the modulation current when there is a comparison signal.

16. The method of claim 11 wherein the step of changing comprises increasing the modulation current when there is no comparison signal, and limiting the increase in the modulation current when there is a comparison signal.

* * * * *